United States Patent [19]

Shariv et al.

[11] Patent Number: 5,990,483
[45] Date of Patent: Nov. 23, 1999

[54] PARTICLE DETECTION AND PARTICLE DETECTOR DEVICES

[75] Inventors: Isaac Shariv, Ramat Hasharon; Yiftach Karni, Rehovot, both of Israel

[73] Assignee: El-Mul Technologies Ltd., Yavne, Israel

[21] Appl. No.: 08/939,735

[22] Filed: Oct. 6, 1997

[51] Int. Cl.[6] .................................................. H01J 37/244
[52] U.S. Cl. .................................. 250/397; 313/103 CM; 313/105 CM
[58] Field of Search .................... 250/397; 313/103 CM, 313/105 CM

[56] References Cited

U.S. PATENT DOCUMENTS

| | | | |
|---|---|---|---|
| 3,603,832 | 9/1971 | Manley et al. | 313/105 CM |
| 4,217,495 | 8/1980 | Robinson | 250/310 |
| 4,535,249 | 8/1985 | Reeds | 250/397 |
| 4,988,867 | 1/1991 | Laprade | 313/105 CM |
| 4,988,868 | 1/1991 | Gray | 250/397 |
| 5,644,132 | 7/1997 | Litman et al. | 250/397 |
| 5,717,206 | 2/1998 | Watanabe et al. | 250/397 |

FOREIGN PATENT DOCUMENTS

| | | | |
|---|---|---|---|
| 2-275368 | 11/1990 | Japan | 250/397 |
| 2039140 | 7/1980 | United Kingdom | 250/397 |

OTHER PUBLICATIONS

James B. Pawley, Lvsem For High Resolution Topographic, "Electron Optical Developments", pp. 222–227.

*Primary Examiner*—Jack I. Berman
*Attorney, Agent, or Firm*—Amster Rothstein & Ebenstein

[57] ABSTRACT

A particle detector for an electron microscope, a mass spectrometer or the like comprises a single flat plate electron multiplier such as a micro-channel plate or a micro-sphere plate followed by a scintillator. The use of the electron multiplier prior to the scintillator compensates for lack of efficiency in passing photons from the scintillator. The output voltage of the scintillator can be freely set.

19 Claims, 6 Drawing Sheets

MCP $R_1 > R_0 \quad R_2 > R_1$

PARTICLE DETECTION AND PARTICLE DETECTOR DEVICES

FIELD OF THE INVENTION

The present invention relates to particle detection and particle detection devices.

BACKGROUND OF THE INVENTION

Particle detectors are important in many applications including mass spectrometers, particle accelerators and electron microscopes. In all of these cases charged particles need to be detected. A detector is provided that transforms the energy, or the presence, of the particle into a form that can be amplified and the amplified form of the signal is then measured to infer the presence of the particle. In a mass spectrometer an ion beam is provided, the energy and current of which carries information about the material being analyzed. In an electron microscope a beam of electrons scans a sample. The beam interacts with the sample in different ways to produce signals that can be detected. In a transmission electron microscope this is achieved as follows, an electron beam passes straight through the sample and is partially absorbed by the sample. The part of the beam that is not absorbed is detected by a particle detector on the far side of the sample and contrasts between areas of different densities are shown. This requires a relatively high energy beam and has the disadvantage that it causes damage to the sample. A further disadvantage is that thin samples are required.

A second form of signal, used in a scanning electron microscope, comprises particles of the original beam that are reflected by the sample. These are known as backscattered electrons and tend to have energies similar to the primary beam, typically 50 eV and above. Backscattered electrons provide good material contrast information, allowing different materials to be distinguished.

A third form of signal, again taken advantage of in the scanning electron microscope, comprises secondary electrons. Secondary electrons are given off by the surface of the sample when struck by a primary electron, that is to say an electron of the original beam. Secondary electrons are of rather low energies, typically of 5 eV and below, certainly below 50 eV. Secondary electrons carry information about the topography of a surface.

There are three main types of particle detectors currently in use in the above-mentioned applications. One is known as a scintillator, the second is a solid state detector, sometimes known as a silicon detector, and the third is a plate. The plate comes in two forms, the first known as a micro-channel plate (MCP), and the second known as a micro-sphere plate (MSP). A scintillator comprises a glass, or other transparent substrate coated with phosphor, or such a transparent material impregnated with scintillating material. The scintillator gives off photons when struck by an electron or other charged particle. The photons pass through a light guide to a photomultiplier tube (PMT). The PMT generates an electronic current which is proportional to the number of photons that reach it and amplifies the electronic signal to generate an output signal strong enough to be passed to a visual display unit or memory or image processing device. Significant photon losses are encountered when transmitting photons from the scintillating body through the light guide to the photomultiplier.

A solid state detector generates electron hole pairs when struck by energetic electrons. These pairs are amplified by an electronic circuit to generate a signal strong enough to be passed to a visual display unit.

One of the problems with a scintillator is that a sufficiently large signal is produced from a single electron only if the electron has sufficient energy, typically 10 keV. Secondary electrons, which have nothing like this level of energy, must therefore be accelerated in order to be detected. Thus the front face of the scintillator is given a voltage level in the region of +10 kV. Because of this field strength it is necessary to position the detectors far from the sample in order to prevent beam aberrations or deflections. This in turn means that detection efficiency is reduced. The same applies to a solid state detector.

The photomultiplier tube, too, has to have a high electric field in order to operate, but at the same time the output signal should preferably be at ground potential so that it can easily be amplified and passed directly to the visual display unit. The only way to do this is to have the front plate of the photomultiplier tube at a strong negative voltage, for example −1.5 kV. The photons are of course immune to electric field so it does not matter that there is a strong negative electric field between the scintillator and the photomultiplier tube.

The MCP (or MSP) is a plate, typically in the region of half a millimeter in thickness and having microchannels extending through the plate. The radius of the microchannel in an MCP is typically 10 $\mu$m and the channel is straight. In the MSP the microchannels twist their way between the two surfaces of the plate. A voltage of typically 1 kV is placed across the thickness of the plate. An electron from the sample impinges on the wall of the microchannel and causes more than one secondary electrons to emerge from the wall. These in turn collide with the wall at a further point and generate more secondary electrons. Provided that there is an appropriately sized field across the plate the result is a multiplication effect. A multiplication of one to ten thousand can typically be obtained from a single MCP plate. However to ensure a sufficient output signal it is generally necessary to stack two or three of these plates one above the other. Each plate in the stack must have a sufficient field strength to ensure that overall a multiplication in the range of a hundred thousand to ten million is achieved.

Again the problem arises that the output signal has to be at ground for the purposes of the visual display unit but the anode of the MCP (or MSP) is at 2 to 3 kV. The problem can be solved by using a capacitor as a buffer. However this works only for low currents because the MCP output is limited to around ten percent of its bias current. An alternative method of buffering is to convert the signal into photons and use a light guide. Either way the result is a device that is complex and is not compact. Compactness is very important as the detector has to fit inside the column of the electron microscope housing or between the exit of the beam from the column and the sample.

An advantage of the MCP (or MSP) based detector is that it is more sensitive to low energy electrons compared to either a scintillator or solid state detector. It therefore does not need to have a strong field at its input face and it can thus be sited much closer to the sample or to the beam path. This improves detection efficiency.

SUMMARY OF THE INVENTION

According to a first aspect of the present invention there is provided a particle detector comprising an electron multiplier and a scintillator, followed by a photomultiplier. In an embodiment a light guide is used to guide photons from the scintillator to the photomultiplier. The light guide may be in the form of a light conducting rod or may comprise flexible fibers.

An electric field enabler is preferably arranged to set up an electric field between the electron multiplier and the scintillator. The electron multiplier and scintillator may be placed in operative proximity to one another, and are ideally oriented with respect to a direction of approaching particles such that approaching particles strike the electron multiplier before being able to reach the scintillator. The electron multiplier may be a micro-channel plate MCP or a microsphere plate MSP. The electron multiplier may be a single plate, in contrast to the prior art in which numerous plates are normally placed in layers one above the other. The 500 to 10000 electrons that may strike the scintillator from the single plate, at typically 500 to 2500 Volts, may create enough photons, for each single electron that was initially detected by the electron multiplier, that significant light losses in the path from the scintillator to the photomultiplier can be tolerated without effecting the detection efficiency. The detection efficiency is a measure of how many of the original electrons that strike the electron multiplier are manifested in the output signal of the photomultiplier.

In an embodiment not only does the scintillator itself comprise scintillating material, but scintillating material also forms light conducting channels to connect the scintillator to a photomultiplier tube. One material is therefore used both for generating the photons and for guiding them through to the PMT and there is no need to index match two materials as is done in current systems.

In order to obtain spatial information about the particles detected, the scintillator may be split into two or more parts, each part being connected to a separate photomultiplier tube. Another way of obtaining spatial information, in particular radial information, is to provide a second scintillator positioned behind the first scintillator away from the sample, wherein the first scintillator has a hole of a predetermined radius and the second scintillator has a hole of a larger radius and wherein each scintillator is connected to a separate photomultiplier tube.

If energetic particles, for which the detection efficiency of the electron multiplier is low, are to be detected, the electron multiplier should preferably be shielded by a thin foil from a particle source direction. The foil is thin enough to allow most of the incoming particles to pass through. The side of the thin foil facing the electron multiplier is preferably coated with a layer of material designed to emit secondary electrons.

According to a second aspect of the invention there is provided a scintillator, for use in a particle detector, comprising an active region for receiving particles and emitting photons, and a conveyance region for passing the photons to an external detecting device, wherein the conveyance region comprises scintillating material made into a form suitable for conveying photons. The conveyance region may be a light guide.

According to a third aspect of the invention there is provided a scintillator for a particle detector, comprising an active region for the detection of particles, and wherein the active region is split into two or more parts, each part being connectable to a separate photomultiplier tube.

BRIEF DESCRIPTION OF THE DRAWINGS

For a better understanding of the invention and to show how the same may be carried into effect, reference will now be made, purely by way of example, to the accompanying drawings in which.

DESCRIPTION OF THE PREFERRED EMBODIMENTS

Figure 1:
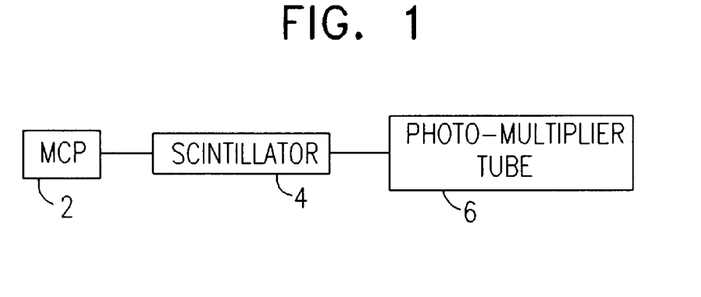
FIG. 1 is a block diagram of a first aspect of the present invention.

FIG. 1 is a schematic diagram of a device operative to carry out a first embodiment of the invention. An electron multiplier 2, such as a micro-channel plate (MCP) is positioned to receive oncoming particles. The particles collide with the MCP, which has a field across it to cause an avalanche effect. Only a single MCP need be provided, rather than the multiple layers seen in the prior art. The multiplication of electrons that is produced is too weak to be used directly to form a signal but is more than adequate for generating photons in a scintillator 4, which is provided at the output of the MCP. A field, as large as 15 kV but typically of the order of 2 to 4 kV, is placed between the MCP and the scintillator, and this is all that is necessary to ensure that the electrons from the MCP are accelerated sufficiently towards the scintillator to be detected. The photons produced at the scintillator 4 upon collision by the electrons are passed, through some form of light guide, to a photomultiplier tube 6 and the output of the photomultiplier tube 6 can be used directly by a VDU or recorded in a computer memory or the like. The output of the photomultiplier tube 6 can be set at any potential required since there is no electrical connection with the input of the scintillator 4. Thus the signal supplied to the VDU can be at ground potential.

Figure 2:
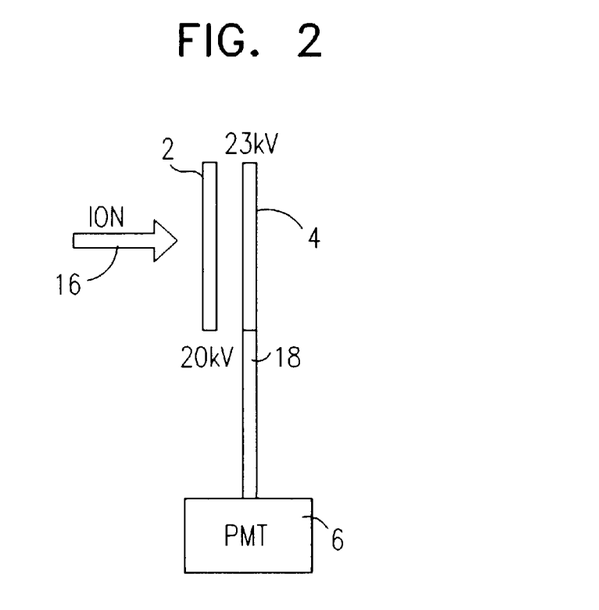
FIG. 2 is a block diagram of an embodiment of the invention for detecting ions.

FIG. 2 shows an implementation of the invention for detecting ions. In this implementation an ion, indicated by arrow 16, strikes an electron multiplier 2. The electron multiplier is held at a voltage of, for example, 20 kV. A small cloud of electrons is generated and accelerated towards a scintillator 4 which is held at a voltage of, for example 23 kV. The cloud of electrons is far too weak to be used directly to form an output but is more than adequate for generating photons in a scintillator. The photons so generated are passed through a light guide or optical fiber 18 to a photomultiplier tube 6.

Figure 3:
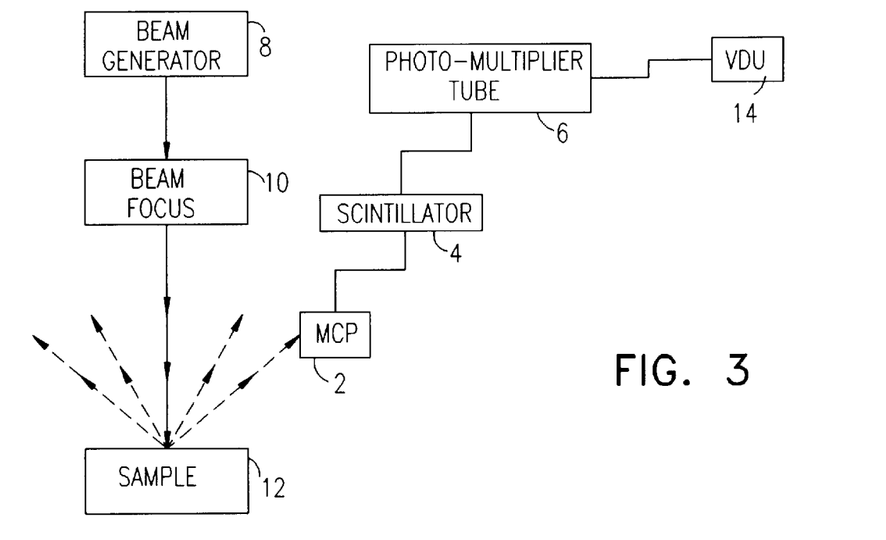
FIG. 3 is a block diagram of an embodiment of the invention for detecting an electron beam as dispersed by a sample.

FIG. 3 shows an embodiment of the invention operative to be usable as part of a scanning electron microscope. In this embodiment a beam generator 8 generates an electron beam. A beam focusing subsystem 10 focuses the beam on the sample. The beam focusing subsystem 10 comprises magnetic field generating devices such as electromagnets and comprises technology well known to the skilled man.

The focused beam is scanned across the surface of a sample 12 and secondary and backscattered electrons are produced. An MCP plate 2 is positioned in the line of either the backscattered or the secondary electrons as appropriate. Generally speaking, backscattered electrons are restricted to those angles where reflection of the beam may be expected. Secondary electrons appear at random angles. The MCP plate 2 produces a cloud of electrons as described above. Again the cloud produced by a single MCP plate is too weak to be used directly to form an output signal and so is passed to the scintillator 4. The scintillator 4 receives an avalanche of electrons rather than a single electron and thus lower energy electrons can be detected. Thus it is no longer necessary to have a high field around the region of the front of the scintillator and the scintillator can thus be placed much closer to the electron beam and the sample without fear of disturbing the beam. The electron avalanche produced by the MCP 2, which is passed to the scintillator, is there converted into photons. The output signal is therefore naturally buffered from the voltage at the input to the scintillator and thus there is no need to further buffer the signal before it reaches the VDU 14 which serves as the output device.

An advantage of the invention is that the aging process of the MCP is slowed. Aging of the MCP is directly proportional to the total emitted charge of the MCP over its lifetime. In the invention the total charge emitted by the single MCP may be in the order of a hundredth of the emitted charge of the last MCP in the sandwich of the conventional MCP detector. Thus the lifetime expectancy is in the order of a hundred times as long.

In the conventional scintillator a glass screen coated with phosphor, or plastic containing scintillating material, gives off photons when struck by an electron. The photons are then passed through a light guide or an optical fiber to a photomultiplier tube to generate a signal strong enough to be passed to a visual display unit. As the scintillator itself is not the same material as the optical fiber, signal loss occurs at the junction. The join is never perfect and the two materials do not have exactly the same refractive index.

In an embodiment of the invention the same scintillating material is used to form the light guide as is used to form the body of the scintillator. Thus there is no join for signal loss to occur. The scintillating material is elongated to form optical fibers and may be provided with a cladding layer or coated with aluminium in the normal way.

Figure 4:
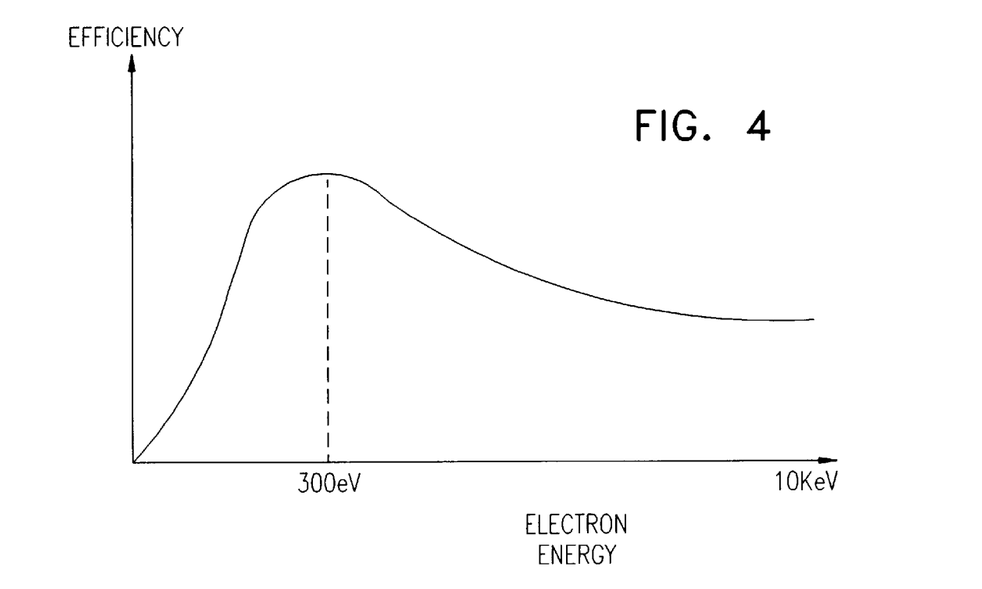
FIG. 4 is a graph illustrating operating characteristics of one of the parts of FIG. 1.

Reference is now made to FIG. 4. FIG. 4 is a graph of the efficiency of the MCP 4 at detecting, that is to say effectively responding to, particles, plotted against the particle energy. It can clearly be seen that the efficiency of the MCP at detecting electrons is a function of the electron energy and the maximum efficiency occurs at an electron energy in the region of 300 eV. Thus many backscattered electrons can be at too high an energy to be detected efficiently.

Figure 5:
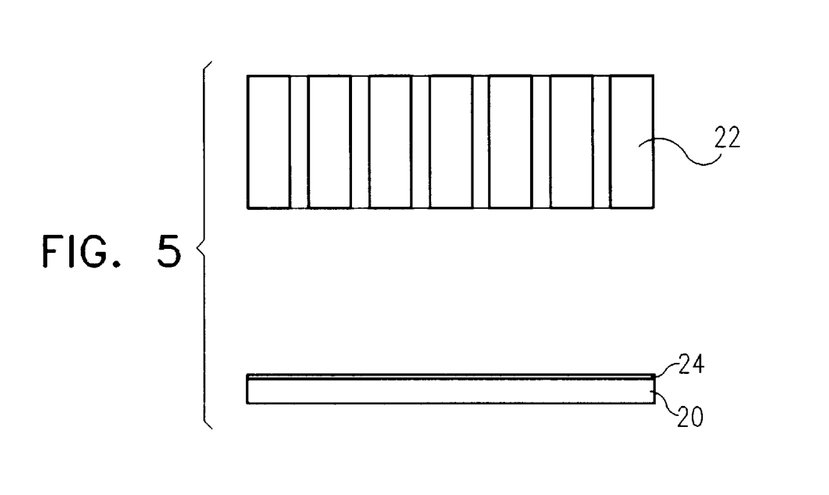
FIG. 5 is a cross-section of a micro-channel tube.

Reference is now made to FIG. 5, which shows a further embodiment according to the invention. As mentioned above, detectors according to the invention may be required to detect both secondary and backscattered electrons, that is they are required to detect particles over a wide range of energies.

In an embodiment of the invention this problem is solved by placing a thin foil 20 in front of the MCP 22 to decelerate, or absorb some of the energy of, the higher energy electrons. These energetic electrons also give off secondary electrons as they pass through the foil. In a further embodiment the metal foil itself is coated with an even thinner layer 24 that gives off a larger number of secondary electrons. These secondary electrons themselves are at too low an energy to detect, typically 1 eV but all that is necessary is to put a 300V field between the foil 20 and the MCP 22 to accelerate these electrons to precisely the level of optimal detection efficiency.

A typical thickness of the foil might be 0.5 µm, although thicknesses of up to 5 µm can be useful depending on the energies of the electrons in the particular application. A typical thickness of the coating for emitting secondary electrons might be 250–400 Angstroms. A typical material for the foil might be a plastic polymer and a typical material for the coating might be oxidized aluminium or CsI A further advantage of this embodiment is that it slows down another aging process of the MCP. Atoms and molecules do not pass through the foil as their mass is much higher than the mass of the electrons. The foil, depending on the material used, is opaque to particles larger than an electron or particles larger than an ion. The foil therefore serves to shield the MCP from pollutants, thus prolonging the lifetime of the MCP.

Figure 6:
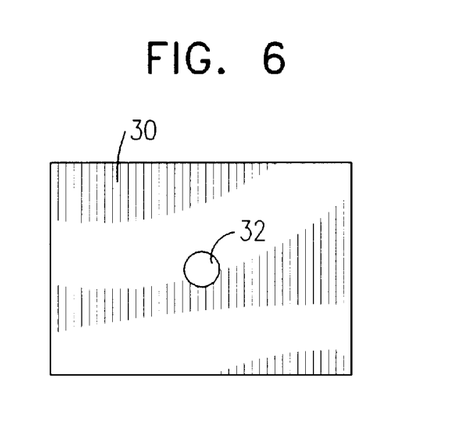
FIG. 6 is an MCP with a central hole.
Figure 7:
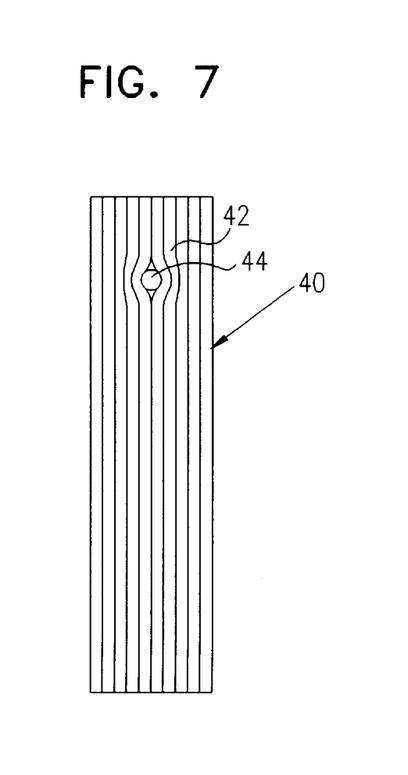
FIG. 7 is a variation of a scintillator.
Figure 8:
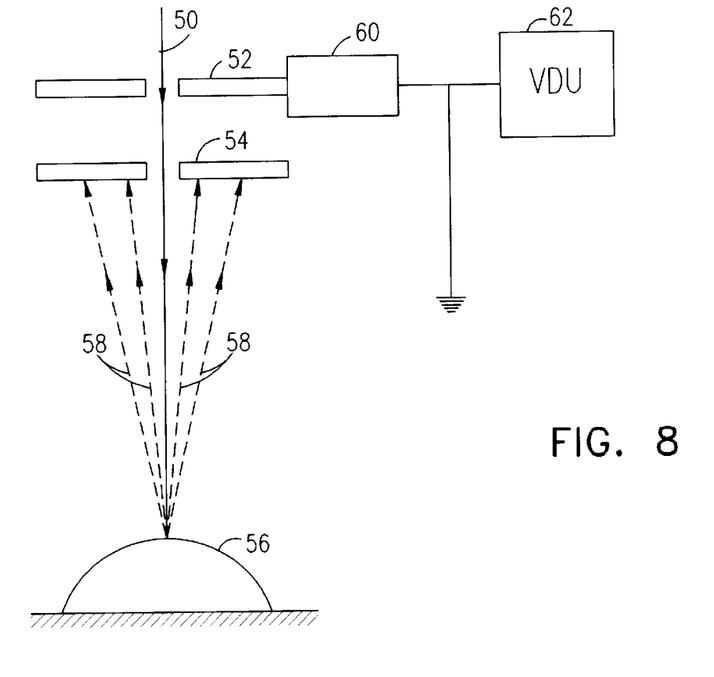
FIG. 8 is a schematic diagram of an embodiment of the invention.

Reference is now made to FIG. 6 which shows an MCP for use in a further embodiment of the invention. It is advantageous for the detection of backscattered electrons to have the detection apparatus as close as possible to the line of the beam. Therefore in the embodiment shown in FIG. 6 an MCP plate 30 is shown built to surround the path of the beam. A hole 32 is constructed in the middle of the plate to allow the beam to pass through. FIG. 7 shows a scintillator 40 made up of scintillating fibers 42, again with a hole 44 in the middle for the path of the beam. FIG. 8 shows how a beam 50 passes through holes in the centers of scintillator 52 and MCP 54 to strike a sample 56. Backscattered electrons follow approximately the kind of path indicated by broken lines 58 and strike the MCP 54. The resulting electron cloud is accelerated towards the scintillator 52 where it generates photons. The photons pass through the fibers of the scintillator to photomultiplier tube 60 to be converted into a signal suitable for input to VDU 62.

Figure 9:
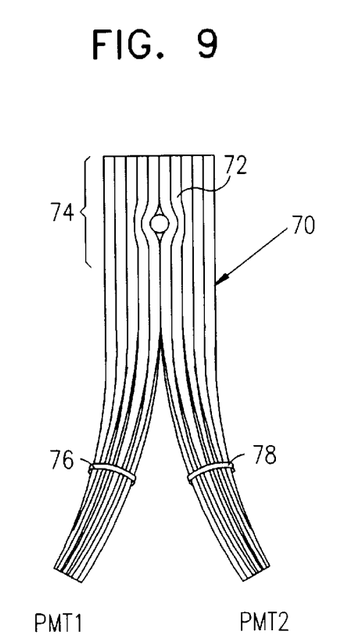
FIGS. 9 and 10 are scintillators according to another aspect of the invention.

Reference is now made to FIG. 9 which shows a scintillator for use in a further embodiment of the invention. The scanning electron microscope obtains spatial information about the sample because the beam that scans the sample is synchronized with the beam in the VDU that scans the screen. All electrons, wherever they might be detected, are interpreted at a given instant as belonging to a particular spot on the sample and go to forming the same pixel on the display. However it is possible to obtain further information about the sample from the spatial distribution of the electrons that are detected. In order to do this it is necessary to have a detector that is split spatially into separate mini-detectors so that the distribution of the particles is retained. In the following description, for the sake of simplicity a detector comprising two mini-detectors will be described. It will be appreciated however, that larger numbers of mini-detectors are possible, depending only on the physical constraints of the construction process and the extent to which additional spatial information is needed.

FIG. 9 shows a scintillator 70 made of scintillating fibers 72. The embodiment is similar to that shown in FIG. 7 except that, beyond active (or detection) region 74 the fibers 72 are split into two bundles 76 and 78, and each bundle is connected to a separate photomultiplier tube.

Figure 10:
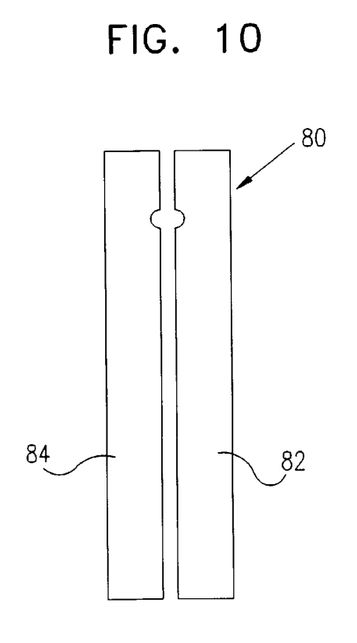

FIG. 10 shows a scintillator 80 of the more conventional sort having a wave guide. Here the light guide or scintillator is physically split into two parts 82 and 84, which again are connected to separate photomultipliers.

It is pointed out that it is only the scintillator that needs to be built in two parts. The MCP that precedes the scintillator in embodiments of the invention preserves spatial information without needing any modification.

Figure 11A:
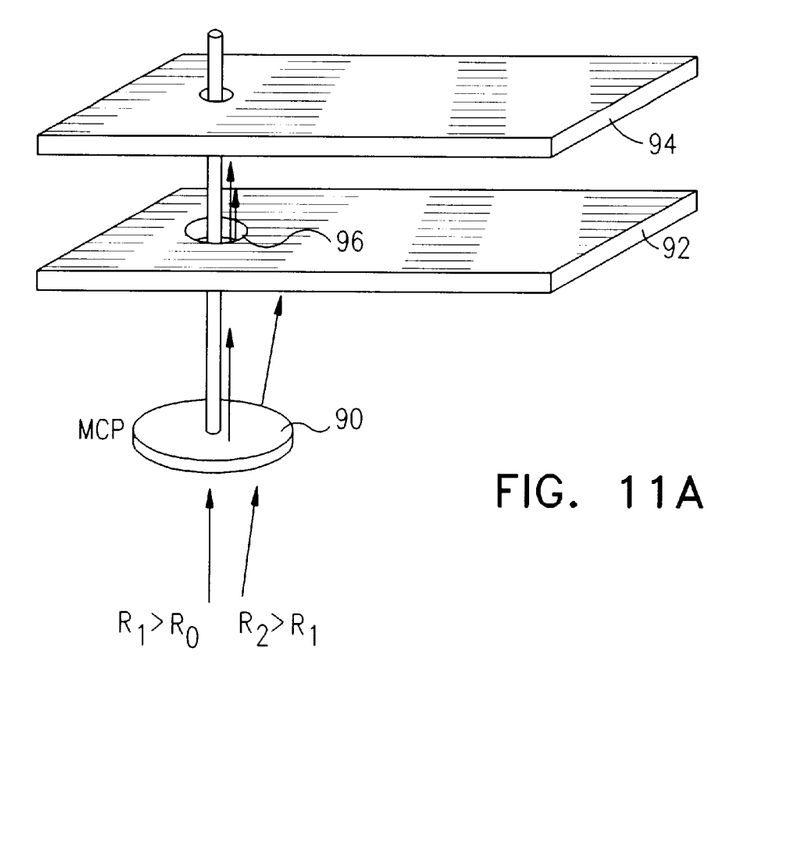
FIGS. 11A, 11B and 12 are arrangements of scintillators according to embodiments of the invention.
Figure 11B:
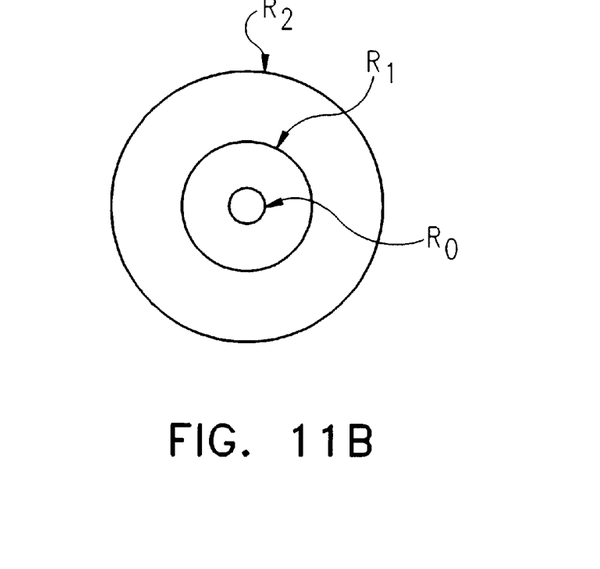

FIG. 11A shows another variation for obtaining spatial information. Here, as in the embodiments shown in FIGS. 6 to 9, the main beam passes through a hole in the center of the detector. Here the electrons returning from the sample hit the MCP 90 which has a radius R2 and central hole of radius R0 and the electron clouds exiting at the far side are accelerated towards scintillators 92 and 94. Scintillator 92 is closer to the MCP 90 and has a central hole 96 of radius R1 Electrons that strike the surface of the scintillator 92 are detected in the normal way and those that pass through strike the second detector 94. FIG. 11B shows the relationship between the three radii R0, R1 and R2. If the three radii are chosen correctly then it is possible to distinguish between secondary and backscattered electrons.

Figure 12:
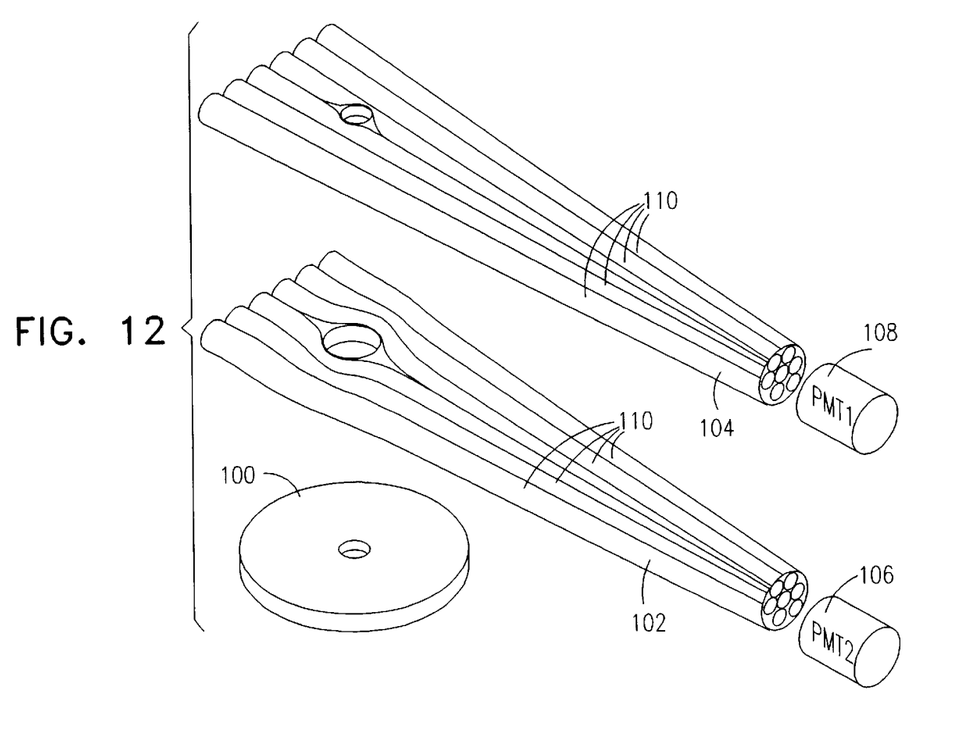

FIG. 12 is a variation of the embodiment of FIG. 11 showing an MCP 100, a first scintillator 102 having a hole of relatively large radius, and a second scintillator 104. Each scintillator is connected to a different photomultiplier 106 and 108 respectively. In the case of FIG. 12 the scintillators are made of separate scintillating fibers 110.

The embodiments of FIGS. 9 to 12 have been described as including an MCP. However it will be appreciated that these embodiments will also work without an MCP, provided that an appropriate field is set up between the sample and the scintillator.

The interior of the electron microscope is a vacuum. It is necessary to site the particle sensing portion of the electron detector inside the vacuum. The photomultiplier tube part of the detector is, however, usually placed outside the vacuum due to constraints on space. This means that the optical fiber connections from the scintillator to the photomultiplier tube must pass through the vacuum seal. It is expensive and complicated to provide a vacuum seal around optical fibers. It is much easier to provide a vacuum seal around electrical connections. Then all that is required is to seal the electrical connection between the photomultiplier tube and the VDU. Alternatively it is possible to seal around the body of the photomultiplier tube, which again is easier than sealing around the optical fibers.

In the claims which follow it is to be appreciated that the phrase electron multiplier includes both a micro-channel plate, MCP, and a micro-sphere plate, MSP.

We claim:

1. A particle detector comprising an electron multiplier followed by a scintillator followed by at least one photomultiplier, having an electric field enabler arranged to set up an electric field between said electron multiplier and said scintillator, said electron multiplier and said scintillator being placed in operative proximity to one another and on the same side of a sample, and
wherein said scintillator is placed sufficiently close to a path of an electron beam heading towards a sample to detect backscattered electrons of said beam deflected from said sample.

2. A particle detector according to claim 1, which is oriented with respect to a direction of approaching electrons such that approaching particles strike said electron multiplier before being able to reach said scintillator.

3. A particle detector according to claim 1 wherein said electron multiplier is a single plate.

4. A particle detector in accordance with claim 1 wherein said scintillator comprises scintillating material, and wherein said scintillating material also forms light conducting channels to connect said scintillator to said at least one photomultiplier tube.

5. A particle detector according to claim 1 wherein said scintillator is split into at least two parts, and wherein each part is connected to a separate photomultiplier tube.

6. A particle detector according to claim 4 wherein said scintillator is split into at least two parts, and wherein each part is connected to a separate photomultiplier tube.

7. A particle detector according to claim 1 additionally comprising a second scintillator positioned away from a particle source direction with respect to said first scintillator, wherein said first scintillator has a hole of a predetermined radius and wherein each scintillator is connected to a separate photomultiplier tube.

8. A particle detector according to claim 1 wherein a thin foil is placed between a sample and said electron multiplier.

9. A particle detector according to claim 8 wherein said thin foil is coated with a layer of material designed to emit secondary electrons.

10. A particle detector according to claim 1, located within the vacuum chamber of an electron microscope.

11. A particle detector according to claim 10 operatively connected to a photomultiplier tube also located within said vacuum chamber of said electron microscope.

12. A particle detector, comprising an electron multiplier followed by a scintillator followed by at least one photomultiplier, wherein an electric field enabler is arranged to set up an electric field between said electron multiplier and said scintillator, said scintillator comprising an active region for receiving particles and emitting photons, and a conveyance region for passing the photons to an external detecting device,
wherein the active region and the conveyance region comprise scintillating material made into a form suitable for conveying photons, said scintillator being split into at least two parts, and each part being connected to a separate photomultiplier tube.

13. A particle detector according to claim 12, wherein the conveyance region comprises scintillating material made into optical fibers.

14. An electron multiplier having a first surface for receiving particles and a second surface for emitting particles, wherein said first surface is shielded by a thin foil, and said first surface and said thin foil disposed with a gap therebetween.

15. An electron multiplier according to claim 14 wherein said thin foil is a plastic foil.

16. An electron multiplier according to claim 14 wherein said thin foil is coated with a layer of material designed to emit secondary particles.

17. An electron multiplier according to claim 14, wherein said thin foil has a thickness of 5 $\mu$m or less.

18. An electron multiplier according to claim 14, wherein said thin foil has a thickness of substantially 0.5 $\mu$m.

19. A particle detector, comprising an electron multiplier followed by a scintillator followed by at least one photomultiplier,
having an electric field enabler arranged to set up an electric field between said electron multiplier and said scintillator, said scintillator comprising an active region for the detection of particles, and
wherein the active region is split into at least two parts, each active region part being connectable to a separate photomultiplier tube via light conveyance means formed from scintillating material.

* * * * *